(12) United States Patent
Zorich et al.

(10) Patent No.: US 6,913,029 B2
(45) Date of Patent: Jul. 5, 2005

(54) MULTIPLE CONTENTS CONTAINER ASSEMBLY FOR ULTRAPURE SOLVENT PURGING

(75) Inventors: Robert Sam Zorich, Carlsbad, CA (US); David Allen Roberts, Encinitas, CA (US); George Oleg Voloshin, San Diego, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/942,218

(22) Filed: Sep. 15, 2004

(65) Prior Publication Data

US 2005/0028841 A1 Feb. 10, 2005

Related U.S. Application Data

(62) Division of application No. 10/621,766, filed on Jul. 17, 2003, now Pat. No. 6,840,252, which is a division of application No. 09/675,376, filed on Sep. 29, 2000, now Pat. No. 6,837,251.
(60) Provisional application No. 60/215,796, filed on Jul. 5, 2000, and provisional application No. 60/213,092, filed on Jun. 21, 2000.

(51) Int. Cl.$^7$ .................................................. B08B 3/08
(52) U.S. Cl. ........................ 134/95.1; 134/98.1; 141/67; 141/100
(58) Field of Search ................ 134/95.1, 98.1; 141/67, 89, 100, 105

(56) References Cited

U.S. PATENT DOCUMENTS

| | | |
|---|---|---|
| 3,958,720 A | 5/1976 | Anderson .................... 221/93 |
| 4,357,175 A | 11/1982 | Buffington et al. ........... 134/10 |
| 4,537,660 A | 8/1985 | McCord ..................... 202/170 |
| 4,570,799 A | 2/1986 | Mednis ....................... 206/509 |
| 4,832,753 A | 5/1989 | Cherry et al. ............. 134/22.18 |
| 4,865,061 A | 9/1989 | Fowler et al. .............. 134/108 |
| 4,874,146 A | 10/1989 | Heid ....................... 244/153 R |
| 5,045,117 A | 9/1991 | Witherell ..................... 134/21 |
| 5,051,135 A | 9/1991 | Tanaka et al. ................ 134/10 |
| 5,106,404 A | 4/1992 | Grant ......................... 55/195 |
| 5,108,582 A | 4/1992 | Foutsitzis et al. ........... 208/138 |
| 5,115,576 A | 5/1992 | Roberson et al. .............. 34/15 |
| 5,240,507 A | 8/1993 | Gray et al. ................... 134/21 |
| 5,297,767 A | 3/1994 | Miller et al. ............. 248/311.2 |
| 5,304,253 A | 4/1994 | Grant ......................... 134/26 |
| 5,339,844 A | 8/1994 | Stanford, Jr. et al. ....... 134/107 |
| 5,398,846 A | 3/1995 | Corba et al. .................. 222/1 |
| 5,409,141 A | 4/1995 | Kikuchi et al. ............... 222/81 |
| 5,425,183 A | 6/1995 | Taylor ........................ 343/73 |
| 5,469,876 A | 11/1995 | Gray et al. ................. 134/105 |
| 5,472,119 A | 12/1995 | Park et al. ............... 222/145.8 |
| 5,509,431 A | 4/1996 | Smith, Jr. et al. .......... 134/95.1 |
| 5,538,025 A | 7/1996 | Gray et al. ................. 134/105 |
| 5,557,381 A | 9/1996 | Sakamoto et al. ........... 355/260 |
| 5,562,883 A | 10/1996 | Salisbury et al. ........... 422/133 |
| 5,565,070 A | 10/1996 | Doi et al. ..................... 203/91 |
| 5,573,132 A | 11/1996 | Kanfer et al. .............. 220/4.23 |
| 5,607,000 A | * 3/1997 | Cripe et al. ................... 141/21 |
| 5,709,757 A | * 1/1998 | Hatano et al. ............ 134/22.14 |
| 5,964,230 A | * 10/1999 | Voloshin et al. ............ 134/98.1 |

FOREIGN PATENT DOCUMENTS

JP            8115886      5/1996      ......... H01L/21/205

* cited by examiner

Primary Examiner—Michael Barr
Assistant Examiner—Saeed Chaudhry
(74) Attorney, Agent, or Firm—Geoffrey L. Chase

(57) ABSTRACT

A process and apparatus to deliver both process chemical and solvent for cleaning the process chemical in a solvent purge refill system along with an integral solvent sorption module, in a single "assembly" that permits ease of shipping, minimal end-user interaction, sufficient solvent for the solvent purge operation, without residual solvent, requiring disposal. This eliminates customer handling of the solvent, and eliminates the customer's need to find a solvent waste facility, as residual solvent can be returned in the same package in one piece/one step.

4 Claims, 8 Drawing Sheets

MULTIPLE CONTENTS CONTAINER ASSEMBLY FOR ULTRAPURE SOLVENT PURGING

CROSS-REFERENCE TO RELATED APPLICATIONS

The present application is a divisional of U.S. patent application Ser. No. 10/621,766 filed Jul. 17, 2003 now U.S. Pat. No. 6,840,252, which is a divisional of U.S. patent application Ser. No. 09/675,376 filed Sep. 29, 2000 now U.S. Pat. No. 6,837,251, which is a continuation-in-part of Provisional patent applications 60/213,092 of 21 Jun. 2000 and 60/215,796 of 5 Jul. 2000.

BACKGROUND OF THE INVENTION

The Present Invention is directed to the field of process chemical delivery in the electronics industry and other applications requiring high purity chemical delivery. More specifically, the present invention is directed to apparatus and processes for the cleaning of process chemical delivery lines, containers and associated apparatus, particularly during changeout of process chemical or process chemical containers in such process chemical delivery lines.

Evacuation and gas purge of process chemical lines has been used to remove residual chemicals from delivery lines. Both vacuum draw and inert gas purge are successful in quickly removing high volatility chemicals, but are not effective with low volatility chemicals. Safety is a problem when extracting highly toxic materials.

Use of solvents to remove residual chemicals is not new. Various patents have sought to clean systems using solvents, which are hereby specifically incorporated by reference in their entirety herein:

U.S. Pat. No. 5,045,117 describes a method and apparatus for cleaning printed wiring assemblies with a solvent and vacuum action.

U.S. Pat. No. 5,115,576 discloses an apparatus and method of cleaning semiconductor wafers using isopropyl alcohol solvent.

Additional patents regarding solvent cleaning include; U.S. Pat. No. 4,357,175, U.S. Pat. No. 4,832,753, U.S. Pat. No. 4,865,061, U.S. Pat. No. 4,871,416, U.S. Pat. No. 5,051,135, U.S. Pat. No. 5,106,404, U.S. Pat. No. 5,108,582, U.S. Pat. No. 5,240,507, U.S. Pat. No. 5,304,253, U.S. Pat. No. 5,339,844, U.S. Pat. No. 5,425,183, U.S. Pat. No. 5,469,876, U.S. Pat. No. 5,509,431, U.S. Pat. No. 5,538,025, U.S. Pat. No. 5,562,883 and Japanese 8-115886.

Various other prior art U.S. Patents are in the same technical field as the Present Invention and are specifically incorporated by reference herein in their entirety:

U.S. Pat. No. 5,472,119—Dec. 5, 1995—Assembly for dispensing fluids from multiple containers;
U.S. Pat. No. 5,398,846—Mar. 21, 1995—Assembly for simultaneous dispensing of multiple fluids;
U.S. Pat. No. 5,297,767—Mar. 29, 1994—Multiple Container Holder;
U.S. Pat. No. 4,570,799—Feb. 18, 1986—Multiple Container Package;
U.S. Pat. No. 3,958,720—May 25, 1976—Adjustable Multiple container dispensing apparatus;
U.S. Pat. No. 5,557,381—Sep. 17, 1996—Develop supplying unit with multiple containers;
U.S. Pat. No. 5,573,132—Nov. 12, 1996—Dispensing Container;
U.S. Pat. No. 5,409,141—Apr. 25, 1995—Two component mixing and delivery system;
U.S. Pat. No. 5,565,070—Oct. 15, 1996—Solvent vapor sucking method and solvent recovering apparatus;
U.S. Pat. No. 4,537,660—Aug. 27, 1985—Vapor generating and recovering apparatus; and
U.S. Pat. No. 5,051,135—Sep. 24, 1991—Cleaning method using a solvent while preventing discharge of solvent vapors to the environment.

Current systems involving solvent purging of internal plumbing lines require separate solvent ampoules. These either take up space inside an existing cabinet or require a separate cabinet with associated plumbing, purging and control features. In addition, these require the use of a solvent capture system to trap the spent solvent for return to the producer's site, or that must be handled as solvent waste.

BRIEF SUMMARY OF THE INVENTION

The Present Invention is a process and apparatus to deliver both process chemical and solvent for cleaning the process chemical in a solvent purge refill system along with an integral solvent capture ampoule, in a single "assembly" that permits ease of shipping, minimal end-user interaction, sufficient solvent for the solvent purge operation, without residual solvent, requiring disposal. This eliminates customer handling of the solvent, and eliminates the customer's need to find a solvent waste facility, as residual solvent can be returned in the same package in one piece/one step.

DETAILED DESCRIPTION OF THE INVENTION

Figure 1:
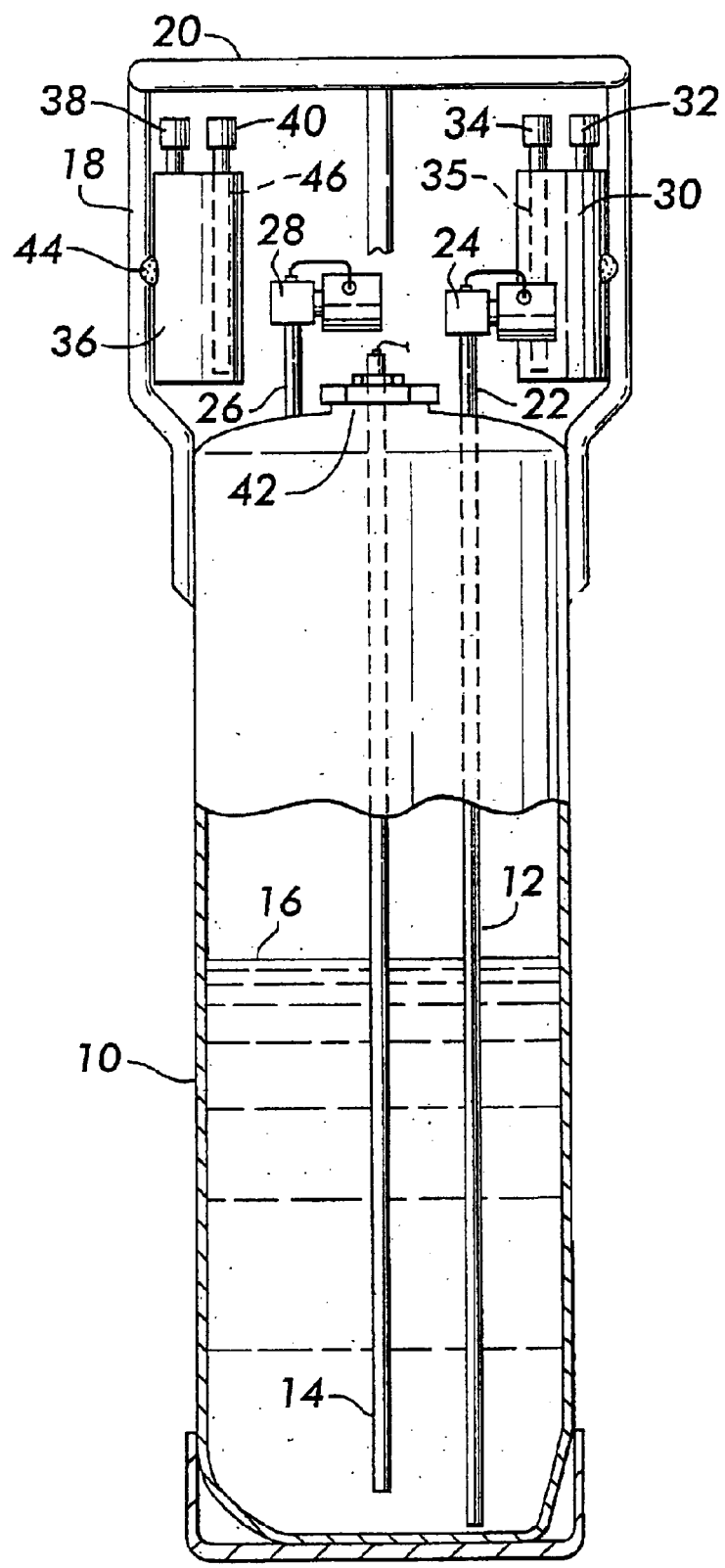
FIG. 1 is a schematic cross-sectional illustration of a first embodiment of the Present Invention.

The Present Invention comprises a plurality of vessels, minimally two vessels; typically, but not exclusively, made from stainless steel, or other suitable materials that are not reactive with the process chemical or solvents in question. The materials of construction of these containers can include, but is not limited to: various types of steel, 316 stainless steel, nickel, Hasteloy, aluminum, chromium or other metals; various types of plastics and polymers, including Teflon, polypropylene, polyethylene, and similar compounds; ceramic materials, including silicon carbide, alumina, and similar compounds; and glass containers, including borosilicate glass, fused quartz and similar compounds.

Either or both of the source chemical and solvent vessels may include liners, internal plating, and other materials of construction. The solvent and source chemical container vessels are not required to be manufactured from the same material, such that the source chemical container may be constructed from steel, while a solvent ampoule may be constructed from plastic, for example.

In addition, the solvent container may contain a plurality of chambers, fluidly communicating with a single outlet or a plurality of outlets, such that the solvent provided for solvent cleaning may be available for more than one cycle, and may be used for alternate chemistries, for example, one chamber may contain a washing ingredient, while another chamber may contain a rinsing ingredient. Finally, one or more chambers may contain a solvent sorption media, wherein one application is to convert a volatile organic chemical (VOC) residue into a solid waste for more convenient handling.

The main source chemical container comprises a large (from 1 liter to 200 or more liter) container, which comprises a sealed storage volume typically filled with process chemicals, a metallic or non-metallic diptube attached either permanently (welded) or removeably (bolted on) extending to near the bottom of the source chemical container, an internal or external level sense, with at least one of the level sensors placed in such a position, typically just above the bottom of the dip tube, that it can indicate low level in the source chemical container. This level sensor may comprise any of the following: metallic or non-metallic float sensors; discrete or continuous ultrasonic level sensors; continuous or discrete thermal sensors; capacitive and or conductivity based level sensors; RF based level sensors; and other similar internal level sensors; or external sensors such as scales, load cells, external ultrasonic or thermal sensors placed either on the container or around the chemical delivery lines; and other similar means for detecting low level.

The low level detection is routed to a solvent purge controller and/or to an operator in order to signal that a solvent purge process is required. The source chemical container will also comprise a plurality of valves, with a minimum of at least one outlet valve attached to the diptube, and in most cases will include a second valve for inert push gas, and/or a third valve for transfer of process chemical from an independent source of process chemical. Each of these valves can be connected integrally either permanently (welded on) or removably (bolted on, through a VCR connection for example). The valves may be manual, but preferably are automatic, comprising pneumatic, electric, hydraulic or solenoid actuated valves.

The source chemical container also comprises a chime ring that is placed on support structures and is used to protect the process valves during shipment.

Another attribute of the source chemical container is that it may integrally contain one or more smaller or secondary "solvent" ampoules either mounted entirely within or otherwise integral to the source chemical container, as opposed to a separate ampoule welded on or bolted on to the source chemical container.

The secondary "solvent" ampoule comprises a small (50 milliliter to one liter) container, which comprises a sealed storage volume typically filled with a solvent that is selected by nature of it's solubility for the process chemical, a metallic or non-metallic diptube either permanently (welded) or removably (bolted on) extending to near the bottom of the solvent ampoule.

An external or internal level sensor may optionally be used in this application also, although with less of a requirement than is needed with the source chemical container. The purpose of this level sensor would be to indicate that the solvent ampoule is empty and to cease further attempts at solvent washing. This level sensor may comprise any of the following: metallic or non-metallic float sensors; discrete or continuous ultrasonic level sensors; continuous or discrete thermal sensors; capacitive and or conductivity based level sensors; RF based level sensors; and other similar internal level sensors; or external sensors such as scales, load cells, external ultrasonic or thermal sensors placed either on the ampoule or around the chemical delivery lines; and other similar means for detecting low level.

The solvent ampoule also includes two openings in the ampoule, one connected to the diptube, and extending to the bottom of the ampoule such that all solvent may be used in the solvent purge process. The other opening extends only into the headspace of the solvent ampoule, and is used for alternately pressurizing, venting and depressurizing the solvent container during the solvent purge operation. These openings may be sealed with manual or pneumatically actuated valves, and attached to the solvent purge control manifold with standard VCR-type or other high purity connectors. The openings may also be sealed with automatically sealing quick disconnect fittings. Typically, the fittings on the solvent ampoule are keyed to prevent accidental crossing of the inlet (headspace) and outlet (diptube) volumes in the solvent ampoule.

This solvent ampoule may comprise a plurality of chambers separated by either vertical (longitudinal) or horizontal (lateral) barriers, which can be used to isolate various cleaning solvents reactive materials or rinse materials, and/or additional solvent for multiple cleaning operations, or for use as a solvent recovery ampoule, either by pushing the solvent into the chamber as a fluid, or by absorbing the solvent into a solid media, such as carbon, and any number of alternative solvent absorbing media, of which a number are available on the open market. This chamber or preferably ampoule is located such that solvent vapors or liquid can be drawn into it, either by process vacuum or through push gas pressure (fluidly communicating with the solvent ampoule), such elevated pressure potentially provided upon initial filling of the solvent ampoule. The sorbent media placed in the solvent capture ampoule can be a number of types of material suitable for trapping and holding the cleaning solvent. For example, activated carbon may be used to capture volatile organic compounds, while materials such as acrylic polymers and caustic and/or acid neutralizers may be used depending on the solvent types. The sorbent material may also comprise liquids that can be used to improve the hazard ratings of the used solvent. Such sorbent materials can be perfluorocarbons, chlorofluorocarbons, and hydrocarbons of either high volatility (such as the perfluorocarbons) or low volatility (such as oils, i.e., Fomblin type fluorocarbon vacuum pump oil), and similar inert compounds. Both low volatility and high volatility in inert sorbent materials may be used depending on process requirements.

Note that each chamber will have at least one, and in most cases a plurality of ports for the delivery of the solvent to the process, and to provide inert gas pressure for pushing the solvent out of the ampoules. In the case of an absorbent ampoule, at least one, but in most cases a plurality of valves are used to direct the spent solvent into the ampoule and to provide a venting or vacuuming of the ampoule to accelerate the absorption of the solvent onto the media.

Additionally, the source of the pressure for the solvent ampoule may come from a pre-pressurization prior to delivery of the solvent ampoule, thereby precluding the need for an inert gas source on the solvent ampoule inlet, and even minimizing the need for such an inlet. Additionally, the capture ampoule may be provided under pre-established vacuum so that spent solvent material may be directed into it without the requirement of a vent port on the solvent capture ampoule.

Additional ampoules can be used in order to accomplish the purposes of cleaning with a compound requiring a rinse and/or to accomplish the purpose of holding solvent absorbing media. Therefore, the use of multiple solvents and rinse solutions and absorbent media can all be envisioned using either multiple ampoules or ampoules with multiple chambers.

The secondary solvent ampoule is then attached to the main source chemical container for shipping purposes. The attachment may be through a direct welding of the secondary ampoule to a portion of the source chemical container, i.e., by welding it to the chime supports; or to the container walls; or to a mounting bracket that is attached to the source chemical container. The attachment can also include bolting the secondary ampoule to the primary (source chemical) container, either through means of a clamp that secures the small ampoule to the chime ring, chime ring support, or to the main body of the container, and through any means of mounting brackets, welded, clamped or bolted to the source chemical container.

In addition, the solvent ampoule may be placed internal to the larger source chemical container so that the only visible part of the solvent ampoule is the two tube connections. In this case, the solvent ampoule may be welded, clamped or bolted to the interior of the source chemical container, and may comprise any combination of separate ampoule walls or shared ampoule walls.

In operation, the source chemical container is connected to a chemical delivery line, such that process chemical may flow to a suitable reaction system. This chemical line includes valves and other components required to perform the solvent purge operation. The solvent ampoule also connects to the solvent purge manifold through additional valving, allowing the solvent to flow in a suitable manner, when commanded to by the operator or by an electronic control unit. The process line communicates with the solvent ampoule through this manifold. When installed, the valves on the solvent ampoule are connected to the solvent purge operation in a leak tight manner, such that the solvent can be transmitted throughout the key affected regions of the process chemical delivery line, that are isolated by the solvent purge manifold control valves. This control may be either manual or automatic and both manual, electrical, pneumatic and hydraulic valves are contemplated.

In one particular embodiment, the main source chemical container is one of the family of 4, 11, 19, and 38 liter stainless steel containers, comprising a variety of level sensors, and containing either two or three valves on the source chemical container. One of the valves communicates with a stainless steel diptube, that protrudes into the chemical volume and is used for dispensing the process chemical. These containers each may contain a chime ring and chime supports. However, a chime ring is not a requirement of this invention, and a suitable container with internal solvent and capture ampoules can be envisioned, without the need for a chime ring or chime ring supports.

The large container may contain any process chemicals or high purity source chemicals, including but not limited to: tantalum pentaethoxide (TAETO), tetrakis(diethylamino) titanium (TDEAT), tetrakis(dimethylamino) titanium (TDMAT), copper hexafluoroacetylacetonate-trimethylvinylsilane (Cu(hfac)TMVS) and similar CVD copper precursors, tetraethylorthosilicate (TEOS) and other chemical vapor deposition (CVD) silicon precursors such as tetramethylcyclotetrasiloxane (TMCTS), boron and phosphorus containing CVD precursors such as trimethylborate (TMB), triethylborate (TEB), trimethylphosphite (TMPi), and triethylphosphate (TEPO), bistertiarybutylaminosilane (BTBAS), tantalum tetraethoxidedimethylaminoethoxide (TAT-DMAE), t-butylimidotrisdiethylamido tantalum (TBTDET), triethyl arsenate (TEASAT) and similar arsenic precursors such as triethyl arsenite (TEOA), low-K spin on materials such as VELOX polyarylene ethers available from Air Products and Chemicals, Inc. of Allentown, Pa., FLARE fluorinated arylene ethers available from Honeywell, SILK aromatic hydrodcarbon resins available from Dow Chemical of Midland, Mich., and other related compounds, where rapid, complete removal of the process chemical benefits from washing of the process piping with a suitable solvent.

The source chemical solvent ampoule is filled with a quantity of source chemical solvent contained in said source chemical solvent ampoule comprising organic alcohols such as methanol, ethanol, propanol, butanol, acetone, tetrahydrofuran, dimethylsiloxane, water, aliphatic hydrocarbons such as hexane, heptane, octane, decane, and dodecane, aromatic hydrocarbons, ketones, aldehydes, hydrocarbons, ethers, esters, glymes, aromatic hydrocarbons, halogen containing alcohols, alkyl nitrites, alkanols, organic amines, fluorinated compounds and perfluorocarbons perfluorohexane, perfluoroheptane and mixtures thereof.

Note also that process chemicals that are reactive, but provide soluble byproducts are also amenable to the present invention, and that the term solvent, in the present invention, is also contemplated in the broad definition of a "solvent" for purposes of the present invention. Included in this category of reactive "solvents" are acids, bases, and reactive solvents. Specific examples are; the use of ethanol with TDEAT, in which titanium ethoxide is produced, and which is soluble in ethanol, ensuring complete removal. Use of nitric acid solutions can be used to remove copper oxidation byproducts, while HF solutions can be used to remove oxidation byproduct materials, such as titanium oxide or tantalum oxide. Such reactive source chemical "solvents" are broadly contemplated as a quantity of source chemical acids or bases, that act in combination as a solvent for the high purity source chemical, or that may react with the high purity source chemical to create high solubility byproducts. This group may comprise HF, $HNO_3$, HCl, $H_2SO_4$, NaOH, KOH, and various other oxidizing and/or reducing agents, as well as organic acids and alkalis that are suitable for reacting or removing the precursor material.

The sorbent media for the source chemical solvent, the residual source chemical cleaned from the solvent purge manifold and any byproducts of any reaction between the solvent and the source chemical may comprise zeolites, aluminosilicates, phosphosilicates, carbon, silica, alumina, molecular sieve, carbon molecular sieve, polymeric adsorbents, polyethylene, polypropylene, resin beds, clays, porous ceramics and other media that has a high surface area and has an affinity for such solvent, source chemical and resulting byproducts. Additionally, the sorbent media may comprise a material that renders the solvent and/or the source chemical inert or at least non-flammable when mixed together in the solvent capture ampoule. It is envisioned that various fluorinated and perfluorinated organic or hydrocarbon liquids or solids would be included in such class of sorbent media. Perfluorocarbons, such as; perfluorohexane, perfluoroheptane and mixtures thereof are exemplary of such sorbent media. Additionally, inert compounds such as vacuum pump oils and/or similar low volatility hydrocarbon or fluorocarbon oils may be used.

The smaller solvent ampoule consists of a small, approximately 150–250 ml stainless steel ampoule comprising two valves, no level sense and a diptube communicating to the outlet valve. The outlet valves are in two styles, one uses standard manual or pneumatic valves, while the other uses quick disconnect fittings to connect to the solvent purge manifold. The small container is mounted to the larger source chemical container through means of a bracket assembly welded or bolted to the smaller solvent ampoule. This bracket assembly is then bolted onto the chime ring supports or chime ring of the source chemical container. Alternatively, the bracket assembly may also be attached directly to the source chemical container, for example by clamping to the neck of source chemical container, or by attachment with bolts, nuts, clips, clamps or other securing means. The absorbent media is placed into a separate ampoule, and the ampoule is attached either removably (bolted on) or permanently (welded on) to the chime ring or chime ring supports. The bracket assembly may also be attached directly to the source chemical container, for example, by clamping to the neck of he container, or by attachment with bolts, nuts, clips, clamps or other securing devices. The sorbent media ampoule communicates with the solvent ampoule through valves and lines that permit either solvent vapor or solvent liquid to be pushed into the sorbent media ampoule.

In the Present Invention, the solvent wash, process chemical and solvent sorption/recovery containers are combined together into a single assembly suitable for shipping and replacing in one piece. This results in a reduced workload for the operator, by not having to replace a separate solvent ampoule; permits the use of fresh, clean solvent with each container replacement; minimizes waste of solvent; and provides the integrated circuit (IC) manufacturer with a mechanism by which he can remove residual quantities of potentially air sensitive or air sensitive, or low vapor pressure process chemicals from their delivery lines. It also eliminates or minimizes the need of the customer to provide any sort of toxic/solvent waste handling requirements. In systems that require separate solvent ampoules, the operator must cycle purge the solvent connections to prevent escape of solvent into the environment; dispose of waste or return a partially filled to filled ampoule of solvent under separate packaging; and must handle an additional vessel in their facility. Therefore, one of the primary benefits of the Present Invention is to reduce handling, increase safety, reduce shipping and waste costs, and confirm that the correct amount of solvent is present to perform the solvent purge task.

When a larger volume of solvent material is required to clean the solvent purge manifold, process lines, mass flow controllers, vaporizers and the like, these ampoules may need to be sized so large as to make it impractical to mount integrally to the source chemical container. The present invention also encompasses those systems in which the solvent ampoule and solvent capture ampoule and the source chemical container are physically separate but are capable of being placed into a single cabinet or adjoining cabinets with fluid communication between the various vessels as described in the present invention.

With reference to FIG. 1, an assembly is shown comprising a high purity source chemical container 10, a source chemical solvent ampoule 36 and a solvent capture ampoule 30. The assembly container 10 may be outfitted with a chime ring bracket 18. The container 10 is outfitted with an outlet 22 and a pneumatic control valve 24, which dispense high purity liquid source chemical from an attached diptube 12 which extends from the outlet 22 to near or a point adjacent the bottom of the container 10 opposite the outlet 22 at the top or chime ring bracket 20 side of the container 10. This facilitates removal of high purity liquid source chemical 16, whose level is typically kept above the diptube 12 and the level sensor 14 which extends to a point slightly above the end of the diptube 12 so that liquid withdrawal can occur after the lowest level signal of the level sensor 14. The level sensor 14 exits the container 10 through a bung or inlet 42 typically closed by a threaded fitting. The level sensor 14 communicates electrically with an automated control unit or operator to control the valves of the assembly in cooperation with the level of high purity source chemical 16.

High purity source chemical could be withdrawn by vacuum, but preferably, a source of pressurizing inert gas, such as nitrogen or helium, is connected to pneumatic valve 28, which controls inlet 26 that communicates with the vapor headspace above the level of the high purity source chemical 16. The pressurizing gas forces liquid up the diptube 12 for downstream use, such as TEOS used in growing silicon oxide on silicon wafers patterned for integrated circuits in an electronics fab furnace.

The high purity source chemical is delivered through a manifold, not shown, to such furnace. During changeout of the container 10, it is desireable to clean the manifold, and for low vapor pressure chemicals, merely drawing a vacuum or using pressurizing gas can be insufficient. Solvent cleaning is desireable.

Solvent compatible to dissolve the high purity source chemical is contained in source chemical solvent ampoule 36, which is welded 44 to the support arm 18 of the chime ring bracket 20 The ampoule 36 has an inlet 38 and outlet 40 which operate much the same as the inlet and outlet of the container 10 using pressurizing gas to force solvent out of the outlet 40 by means of the diptube 46.

Figure 8:
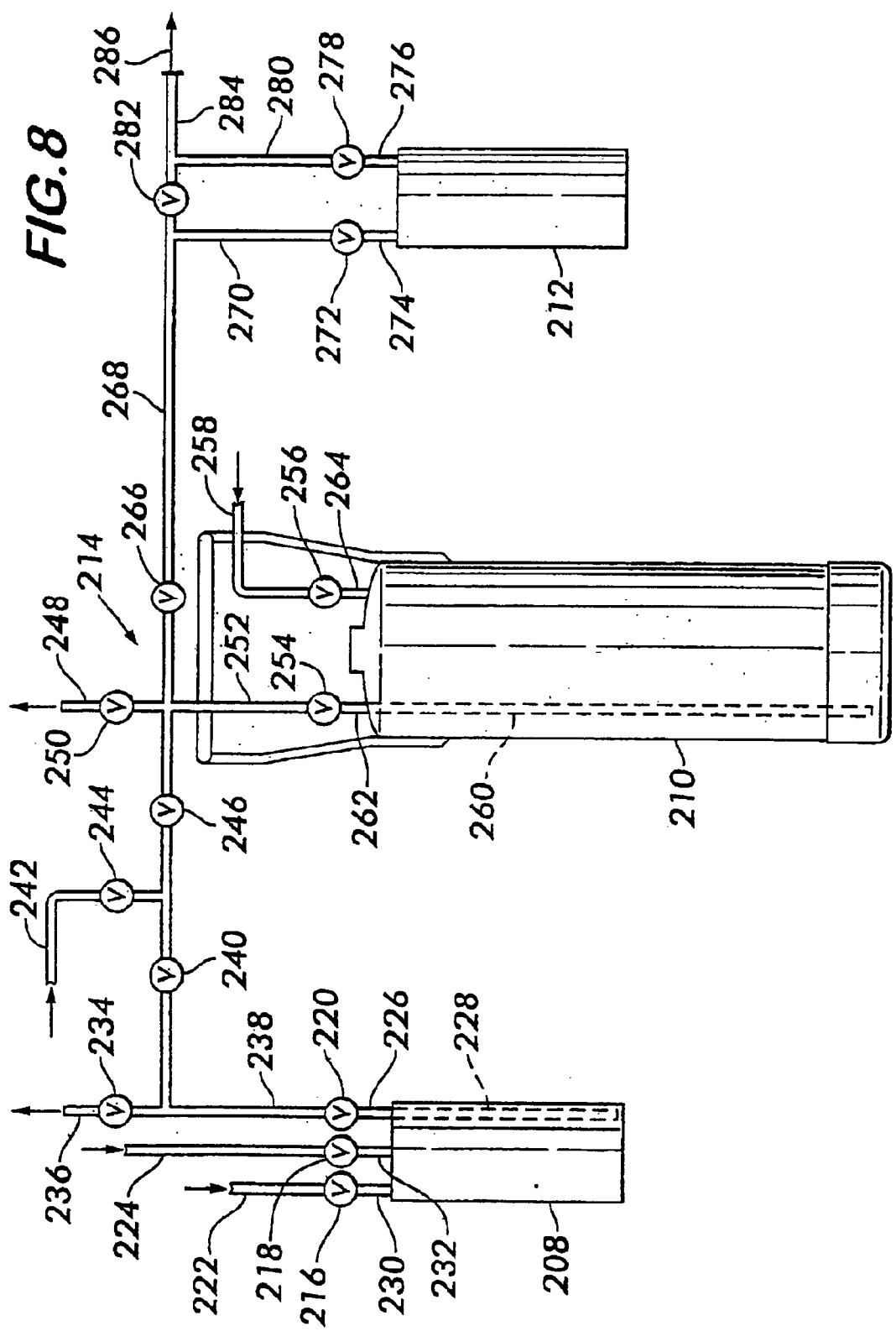
FIG. 8 is a schematic illustration of a manifold for an embodiment of the Present Invention.

The solvent passes through the manifold, shown in FIG. 8, to remove residual high purity source chemical, which is collected as a waste stream of solvent and chemical in the solvent capture ampoule 30 via inlet 32. The ampoule 30 is also fitted with an outlet 34 for convenience of regeneration. Ampoule 30 preferably has a diptube 35 connected to outlet 34 to facilitate cleanout of ampoule 30 and to reduce manufacturing parts so that ampoule 30 is interchangeable with ampoule 36, but it is also contemplated that ampoule 30 would not have a diptube 35 attached to outlet 34. The ampoule 30 can be an empty receiving ampoule or it can be filled with a sorbent for the solvent and chemical, such as silica.

The inlets and outlets of both ampoules can preferably be operated by valves connected to the automated control unit, not illustrated.

Figure 2:
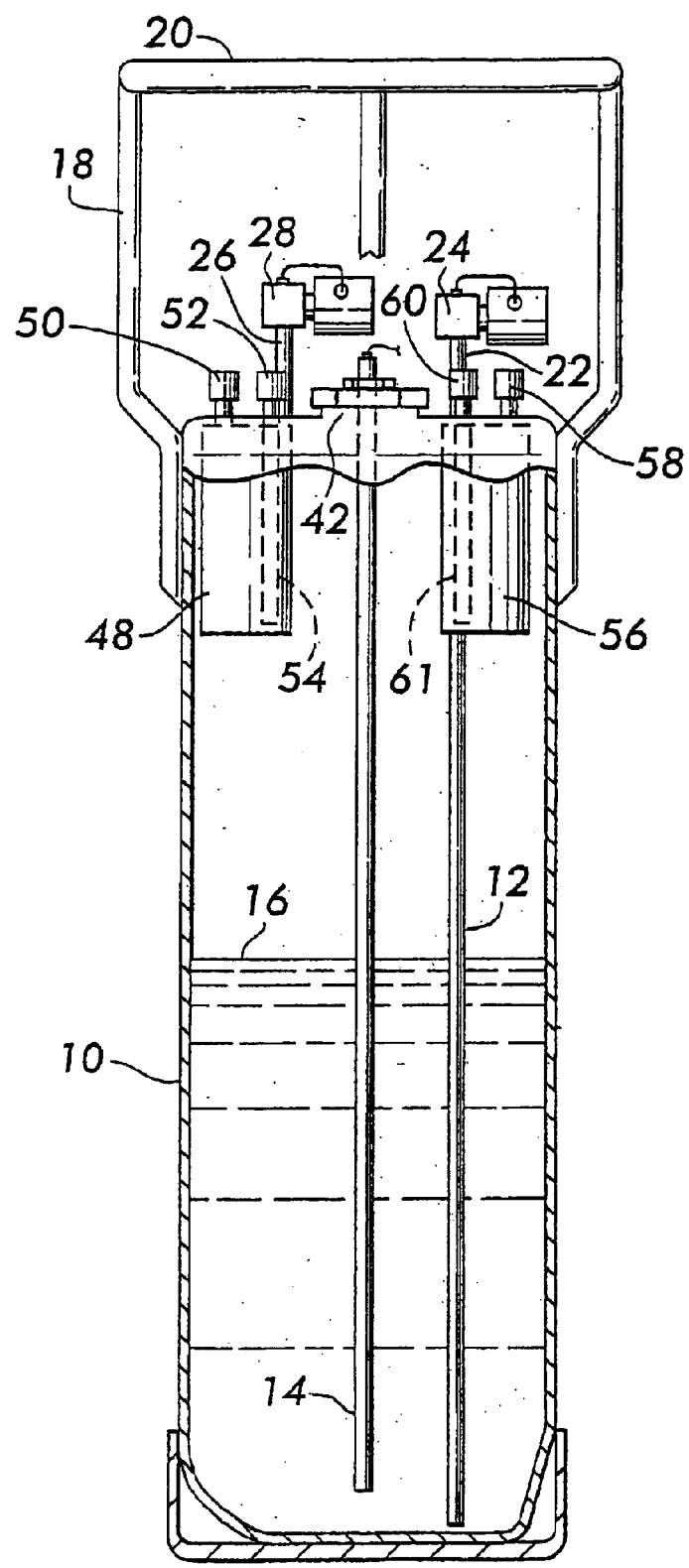
FIG. 2 is a schematic cross-sectional illustration of an embodiment of the Present Invention.

With reference to FIG. 2, common parts are labeled with the same part numbers as FIG. 1 and will not necessarily be repeated in this description of this second embodiment showing the ampoules situated in the interior of the container 10. The source chemical solvent ampoule 48 has an inlet 50 and an outlet 52 that function similarly to the assembly of FIG. 1, with outlet 52 having an integral diptube 54. Used solvent from ampoule 48 after passing through the manifold, not shown, is recovered in the interiorly situated solvent capture ampoule 56, which has an inlet 58 and outlet 60, which operate in a manner consistent with the assembly of FIG. 1. Outlet 60 may have a diptube 61, if desired.

Figure 3:
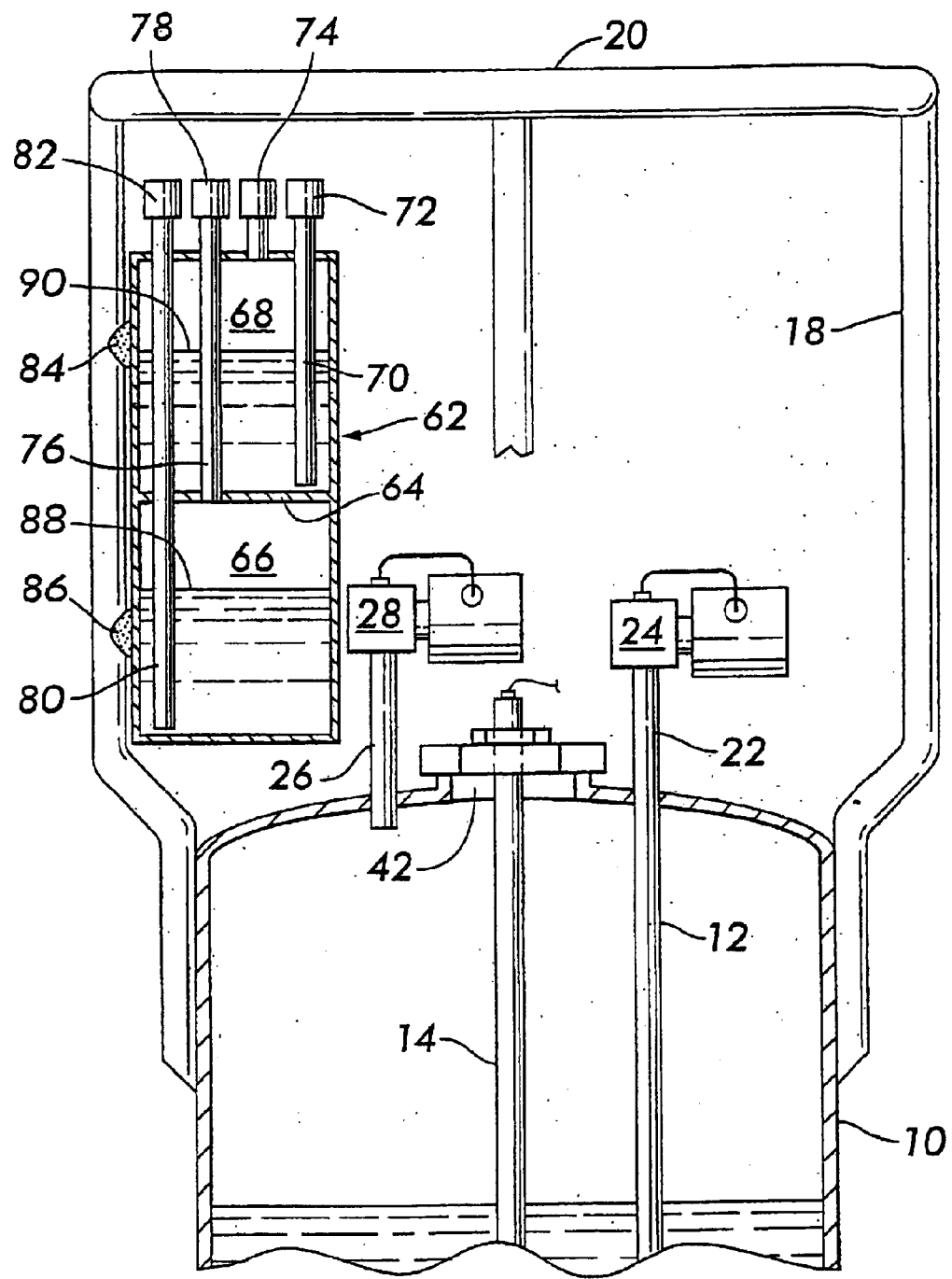
FIG. 3 is a schematic partial cross-sectional illustration of an embodiment of the Present Invention.

With reference to FIG. 3, common parts are labeled with the same part numbers as FIG. 1 and will not necessarily be repeated in this description of this third embodiment showing a baffled 64 ampoule 62 having discrete solvents 88 and 90 or a solvent in one ampoule 66 and an empty ampoule 68 or sorbent filled ampoule 68. Either ampoule 66 and 68 could serve either function depending only on connection to the manifold and programming of the automated control unit. Ampoule 68 is outfitted with an inlet 74 and an outlet 72, the latter of which is integral to a diptube 70 for liquid out service. Pressurizing gas would be administered through inlet 74. Ampoule 66 being below ampoule 68 has a diptube 76 and 80, respectively, connected to each of its inlet 78 and outlet 82. The extent of any diptube or the existence of such a diptube is dependent on whether the ampoule is being used for solvent such as dual solvent delivery or whether it is being use as the solvent capture ampoule, with or without sorbent. The ampoules are welded to the chime ring bracket 20 by welds 84 and 86.

Figure 4:
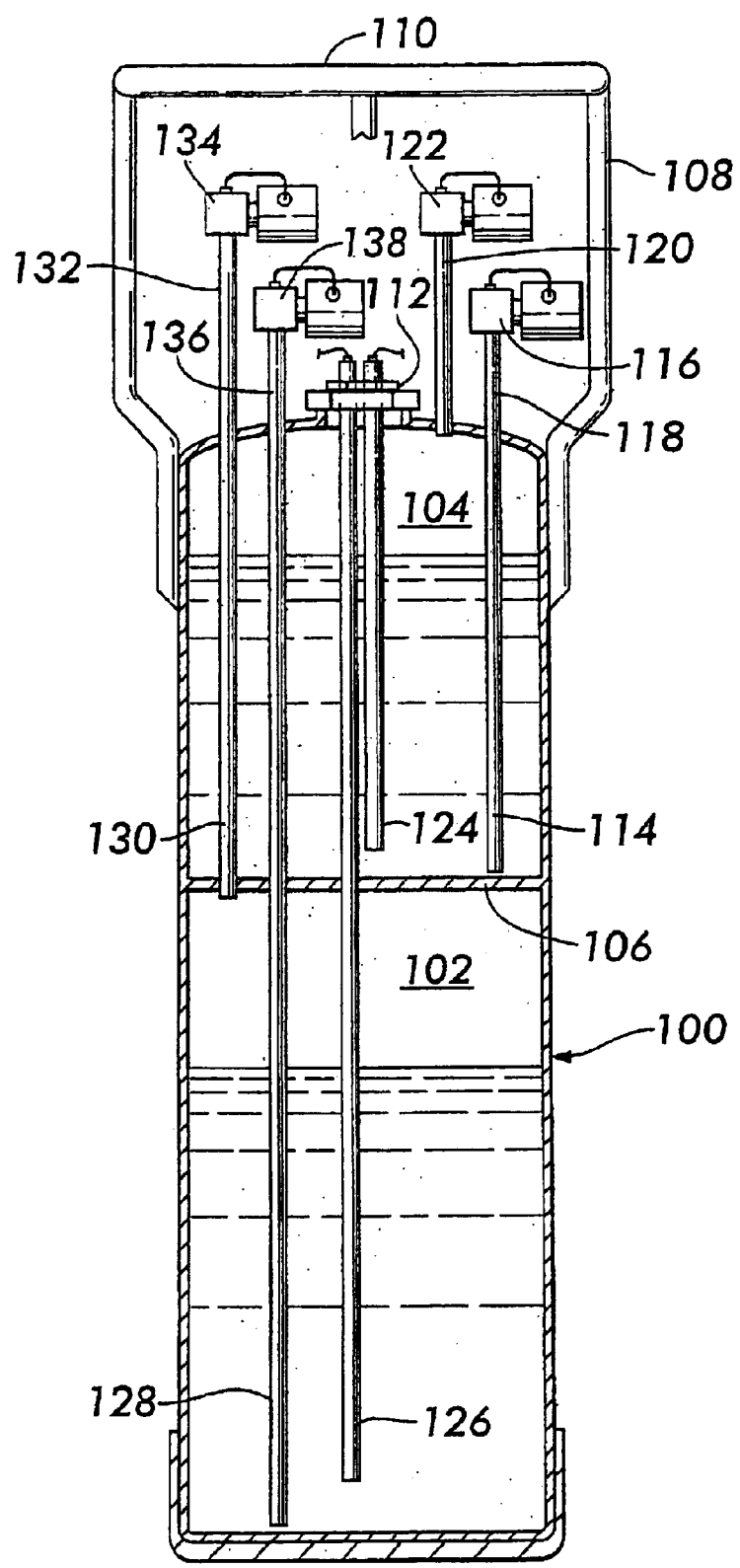
FIG. 4 is a schematic cross-sectional illustration of an embodiment of the Present Invention.

With reference to FIG. 4, an alternate embodiment of the assembly is shown. Container 100 comprises chambers 102 and 104 separated by baffle 106. Each chamber has an inlet and an outlet. For instance, chamber 104 has an inlet 120 controlled by valve 122 and an outlet 118 controlled by valve 116 and ending in a diptube 114 functioning much as described with reference to FIG. 1. A level sensor 124 and 126 passes through bung 112 to service each chamber respectively. The lower chamber 102 has an inlet 132 and outlet 136 controlled by valves 134 and 138 respectively. Inlet tube 130 accesses the headspace of chamber 102, and diptube 128 withdraws liquid source chemical based upon the pressure of the pressurizing gas entering via tube 130, as described in similar circumstance with regard to FIG. 1. This allows for several source chemicals to be transported and contained in one assembly. Although the ampoules for solvent and solvent capture are not illustrated, it is appreciated that the same configuration of ampoules can be used with container 100 as is described for FIGS. 1–3.

Figure 5:
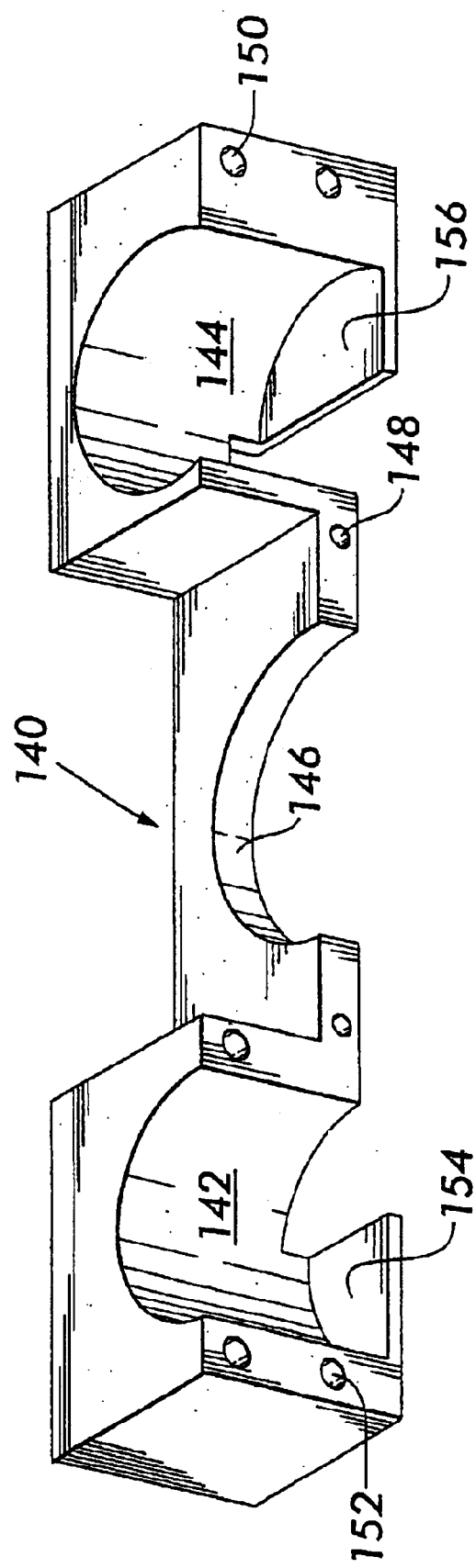
FIG. 5 is a perspective view of one of two mirror image mating bracket sections for holding the solvent ampoules on a source chemical container.

With reference to FIG. 5, one 140 of two mating sections of an ampoule bracket is shown. Ampoule bracket section 140 fits around the assembly bung 42 (FIG. 1) and clamps by friction fit the outer edge of bung 42 by turning bolts which threadably engage engagement holes 148. Edge 146 interfaces with the bung 42. The source chemical solvent ampoule 36 (FIG. 1) and the solvent capture ampoule 30 (FIG. 1) fit into either of holders 142 and 144 which frictionally engage the ampoules by threaded engagement holes 150 and 152 using bolts, not illustrated. The ampoules rest on support surfaces 154 and 156.

Figure 6A:
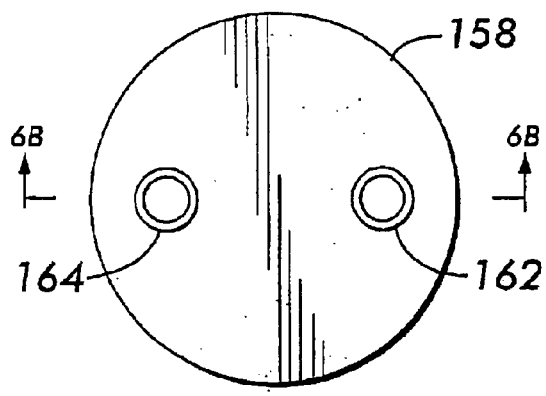
FIGS. 6A and B are a plan view and a cross-sectional view of an embodiment of a solvent ampoule of the Present Invention.
Figure 6B:
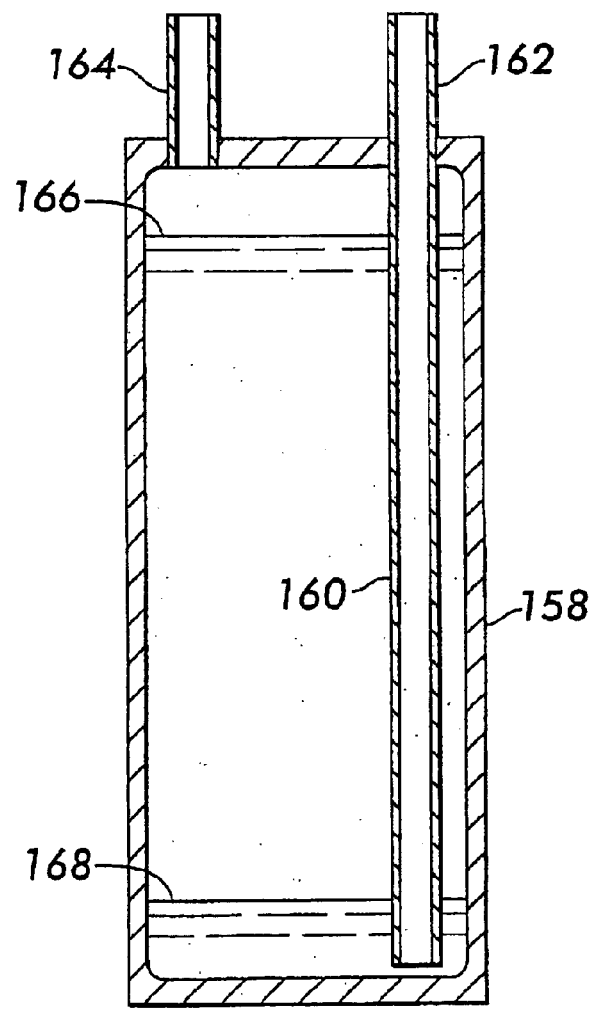

With reference to FIGS. 6A and B, a source chemical solvent ampoule 158 is shown in greater detail. The ampoule 158 has inlet 164 and outlet 162 connected to diptube 160. This allows liquid solvent to be removed, generally from level 166, full, to level 168, empty.

Figure 7:
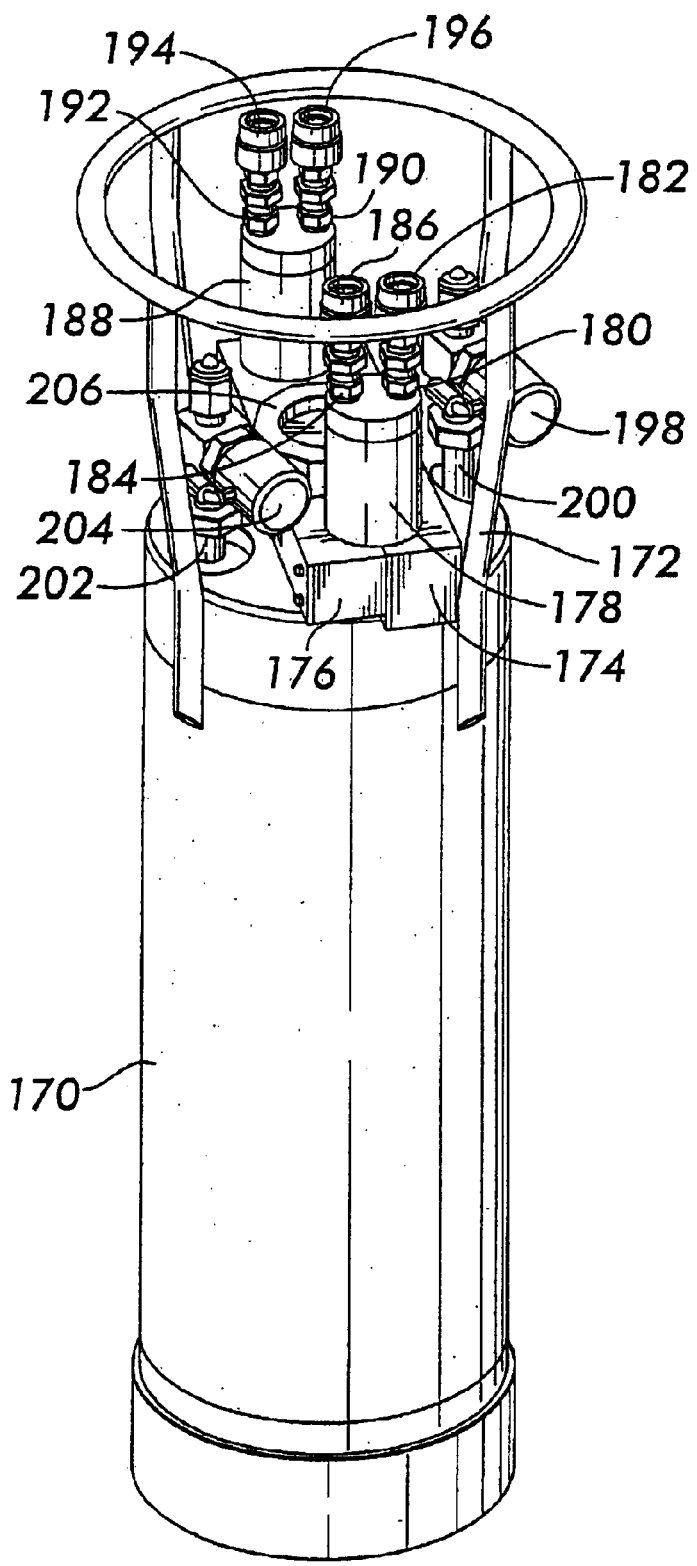
FIG. 7 is a perspective view of a source chemical container, solvent support bracket, solvent ampoule and solvent capture ampoule of a preferred embodiment of the Present Invention.

A perspective view of the assembly of the Present Invention is shown in FIG. 7. Container 170 has ampoule bracket sections 174 and 176 holding ampoules 178 and 188. Each ampoule has an inlet 180 and 190 and one outlet 184 and 192, respectively. These are connected to quick disconnect fittings 194, 196, 186 and 182, respectively. Container inlet 202 is controlled by pneumatic valve 204. Container outlet 200 is controlled by pneumatic valve 198. These components are generally protected by the chime ring bracket 172. An optional level sense can be fitted through bung 206.

With reference to FIG. 8, the manifold 214 in which the present invention's assembly operates and communicates is depicted. Source chemical solvent ampoule 208 is communicating with the solvent purge manifold 252 of high purity source chemical container 210 and solvent capture ampoule 212. It is also contemplated that this manifold connection can be made with ampoules internally positioned in the container 210. The solvent in ampoule 208 can either be under pressure from filling or can be pressurized by an inert push or carrier gas 222 introduced through valve 216 to inlet 230 to force solvent up through diptube 228 to outlet 226 and through valve 220. Refill of the ampoule 208 can be accomplished through inlet 232 controlled by valve 218 in receiving fresh or recycled solvent 224. Solvent from ampoule 208 passes through line 238 and valves 240 and 246 to clean the solvent purge manifold 252 which is defined by valves 246, 250, 266 and 254. Vacuum can be applied to line 238 particularly during cleanout through valve 234 and vacuum source 236. Additionally, inert purge gas can be administered from source 242 and valve 244 to clean out line 238. High purity source chemical in container 210 is pushed out of diptube 260 by an inert push gas source 258 controlled by valve 256 communicating with container 210 through inlet 264. An additional fill inlet to replenish source chemical is contemplated but not illustrated. Source chemical passes through valve 254 to solvent purge manifold 252 and through valve 250 to a point of use 248 or end use, such as an electronics fabrication process tool to make integrated circuits or computer chips. During clean out of the solvent purge manifold 252, solvent is cycled through the manifold 252 from valve 246 through valve 266 by the force of the solvent's pressure or push gas or the vacuum that may exist in capture ampoule 212. This forces solvent, residual source chemical or any decomposition products, if the solvent is reactive with the source chemical, to pass through line 268, line 270, valve 272, inlet 274 and capture ampoule 212 which may be empty or it may contain a sorption media. The solvent capture is activated potentially by vacuum drawn on ampoule 212 through outlet 276, valve 278, lines 280 and 284 toward a source of vacuum 286. That source may contain abatement or appropriate traps for various contemplated chemicals and solvents. Alternately, vacuum can be bypassed around ampoule 212 by opening valve 282 and closing valves 272 and 278. It is contemplated that capture ampoule 212 does not need to be connected to a vacuum source 286, but can rely on vacuum conditions pre-established in ampoule 212 in a sealed fashion upon manufacture or refilling or refurbishing, or reliance can be made on the pressurized solvent to move the chemicals to ampoule 212 with or without venting through line 284.

The Present Invention provides a significant advantage in the use of high purity chemicals in a delivery system, such as in the electronics fabrication industry. Maintenance of the high purity of the source chemical requires not only the purity of the source chemical, but also the delivery system through which the chemical is dispensed. Traditionally, the industry has used multiple cycles of vacuum and purging with an inert pressurized gas to maintain cleanliness of the delivery system. However, with low volatility chemicals, such cyclic cleaning is not sufficient. Solvents for such low volatility chemicals are desirable. The Present Invention provides a unique system for providing such solvents and their disposal without adversely effecting the traditional way in which operators in the electronic fabrication industry utilize containers of source chemicals. This provides essentially a seamless system for providing ultra cleanliness for even difficult source chemicals, such as low volatility chemicals and overcomes a long standing problem of sustaining purity of source chemicals through process lines and changeout of containers of such source chemicals and sequential use of different source chemicals in the same delivery system.

The Present Invention has been set forth with regard to several preferred embodiments, but the full scope of the invention should be ascertained from claims which follow.

What is claimed is:

1. A high purity source chemical container assembly, comprising; a high purity source chemical container, at least one inlet to the interior of the source chemical container, at least one outlet from the interior of the source chemical container, at least one source chemical solvent ampoule integral to said assembly, at least one inlet to the interior of the source chemical solvent ampoule, at least one outlet from the interior of the source chemical solvent ampoule, at least one solvent capture ampoule integral to said assembly sized to accommodate source chemical solvent from said source chemical solvent ampoule, and at least one orifice communicating with the interior of the solvent capture ampoule, wherein the source chemical solvent ampoule and the solvent capture ampoule comprise a single baffled ampoule.

2. The assembly of claim 1 wherein said source chemical solvent ampoule contains a solvent under pressure without connection to an external source of pressure.

3. The assembly of claim 1 wherein the interior of said solvent capture ampoule is under vacuum without connection to a source of vacuum.

4. A high purity source chemical container assembly, comprising; a high purity source chemical container, an inlet to the interior of the source chemical container having an integral pneumatic valve for connection to a source of pressurizing inert gas, an outlet from the interior of the source chemical container having an integral pneumatic valve for connection to a manifold to deliver high purity source chemical to a downstream process using said chemical said outlet having a diptube extending to a point adjacent a bottom of said source chemical container, at least one source chemical solvent ampoule integral to said assembly, an inlet to the interior of the source chemical solvent ampoule having an integral pneumatic valve for connection to a source of pressurizing inert gas, an outlet from the interior of the source chemical solvent ampoule having an integral pneumatic valve for connection to said manifold which delivers high purity source chemical to a downstream process, a solvent capture ampoule integral to said assembly sized to accommodate source chemical solvent from said source chemical solvent ampoule, and an orifice communicating with the interior of the solvent capture ampoule to receive source chemical solvent from said source chemical solvent ampoule through said manifold, wherein the source chemical solvent ampoule and the solvent capture ampoule comprise a single baffled ampoule.

* * * * *